United States Patent [19]

Okuaki

[11] Patent Number: 4,635,165
[45] Date of Patent: Jan. 6, 1987

[54] PRINTED-CIRCUIT CONSTRUCTION WITH EPROM IC CHIP MOUNTED THEREON

[75] Inventor: Hiroshi Okuaki, Tokyo, Japan

[73] Assignee: Oki Electric Industry Co., Ltd., Tokyo, Japan

[21] Appl. No.: 676,402

[22] Filed: Nov. 29, 1984

[30] Foreign Application Priority Data

Nov. 30, 1983 [JP] Japan ................................. 58-224393

[51] Int. Cl.$^4$ ............................................. H05K 7/06
[52] U.S. Cl. .................................. 361/400; 174/52 FP
[58] Field of Search ............... 361/400, 401, 402, 403, 361/404, 405, 406, 407, 408, 409, 410, 411, 412, 413, 414, 415; 174/52 FP

[56] References Cited

U.S. PATENT DOCUMENTS 3,404,215 10/1968 Burks et al. ..................... 174/52 FP
3,660,819 5/1972 Frohman-Bentchkowsky. 307/304 X

OTHER PUBLICATIONS

Gerson, "Package Piggybacks Standard E-PROM to Emulate One-Chip Microcomputer," *Electronics*, Jan. 31, 1980, pp. 89-92.

*Primary Examiner*—A. D. Pellinen
*Assistant Examiner*—Morris Ginsburg
*Attorney, Agent, or Firm*—Wenderoth, Lind & Ponack

[57] ABSTRACT

A printed-circuit construction having an EPROM IC chip on the surface of an insulating baseboard. The insulating baseboard has on a primary surface a printed circuit pattern and a semiconductor chip support region. The EPROM IC chip is fixed to the semiconductor chip support region of the insulating baseboard. Thin metal wires connect electrodes of the EPROM IC chip to the printed circuit pattern. A cap is fixed to the primary surface of the insulating baseboard in covering relation to a surface of the EPROM IC chip and the thin metal wires. The cap is made of a material capable of transmitting ultraviolet radiation therethrough.

3 Claims, 2 Drawing Figures

PRINTED-CIRCUIT CONSTRUCTION WITH EPROM IC CHIP MOUNTED THEREON

BACKGROUND OF THE INVENTION

The present invention relates to a printed-circuit construction in which an erasable programmable read-only memory is mounted on the surface of a printed-circuit board.

EPROM (Erasable Programmable ROM) IC devices are widely used in various digital electronic systems in recent years.

EPROMs can easily be reprogrammed by users since written information can be erased by exposure to ultraviolet radiation and new information can easily be written therein.

The EPROM is composed of floating-gate MOS transistors providing nonvolatile storage of information. The U.S. Pat. No. 3,660,819 discloses a floating-gate MOS transistor in detail.

An EPROM IC and other control and drive IC devices are mounted on a printed-circuit board, and used as components for a digital electronic system. The printed-circuit board can be dismounted from the digital electronic system, so that information stored in the EPROM IC can easily be rewritten.

FIG. 1 of the accompanying drawings illustrates a conventional arrangement in which an EPROM IC device is mounted on a printed-circuit board.

As shown in FIG. 1, an insulating baseboard 2 is formed of glass epoxy resin, for example, and an electrically conductive pattern 1 and contacts 15 are printed on the insulating base board 2.

An EPROM IC device 3, has gate pins 7 inserted in through holes 14 in the baseboard 2 and soldered in place. The EPROM IC device 3 includes an EPROM IC chip 10 housed in a ceramic package 5 having a window 12 for passage of ultraviolet radiation therethrough.

The package 5 is composed of a ceramic base 6 having a chip support 9 in the form of a sintered layer of gold paste, a lead frame having a plurality of lead pins 7, and a ceramic cap 13 having the window 12. The IC chip 10 is thermally pressed and fixed to the chip support 9, and has electrodes connected by thin metal wires 11 to the lead pins 7.

The ceramic base 6, the ceramic cap 13, and the lead frame are bonded by a glass material 8 having a low melting point at a sealing tempearture ranging from, 400° to 500° C.

Since the sealing temperature is high when the ceramic package 5 is employed, aluminum pad electrodes of the IC chip 10 and the lead pins 7 are connected by wires of the same material, that is, aluminum wires. This prevents the connecting wires from being subjected to a resistance increase or breakage which would otherwise be caused by the formation of an alloy of the aluminum pad electrodes and a different material, that is, gold wires.

In order to keep the substrate of the IC chip 10 at an earth potential level, the sintered layer 9 of gold paste and the lead pins 7 are required to be connected by thin metal wires. To prevent the sintered layer 9 and the thin metal wires from forming an alloy, a small silicon piece (ground dice) having an aluminum layer on its surface is fixed to the surface of the sintered layer 9, and the ground lead pin 7 is connected by an aluminum wire to the pad electrode of the IC chip through the surface of the ground dice.

As described above, quite a complex process is required to seal the IC chip in the ceramic package.

The printed-circuit board can be used as a component of the digital electronic system by inserting the contacts 15 on an end of the insulating baseboard 2 into a female connector (not shown).

Thus, the conventional EPROM construction is disadvantageous in that the IC package takes up a large area of the printed-circuit board and it is difficult to reduce the thickness of the entire construction. The mounting cost is increased by placing the package with the IC chip mounted therein on the printed-circuit board.

To solve the above problems, there is known chip-on-board technology in which an IC chip is placed directly on the surface of a printed-circuit board, and the IC chip and the printed circuit are covered with synthetic resin.

It has however been difficult to apply the chip-on-board technology to EPROM IC chips since the EPROM IC chip is required to have a window for receiving ultraviolet radiation therethrough.

SUMMARY OF THE INVENTION

It is an object of the present invention to provide a construction in which an EPROM IC chip is mounted on a printed-circuit board.

Another object of the present invention is to provide a construction in which an EPROM IC chip is mounted on the surface of a printed-circuit board at a low cost.

A printed-circuit construction according to the present invention comprises an insulating baseboard having on a primary surface a printed circuit pattern and a semiconductor chip support region, an EPROM IC chip fixed to the semiconductor chip support region of the insulating baseboard, thin metal wires connecting electrodes of the EPROM IC chip to the printed circuit pattern, and a cap made of a material capable of transmitting ultraviolet radiation therethrough and fixed to the primary surface of the insulating baseboard in covering relation to a surface of the EPROM IC chip and the thin metal wires.

The above and other objects, features and advantages of the present invention will become more apparent from the following description when taken in conjunction with the accompanying drawings in which a preferred embodiment of the present invention is shown by way of illustrative example.

DETAILED DESCRIPTION

A printed-circuit construction according to the present invention will be described with reference to FIG. 2.

Figure 1:
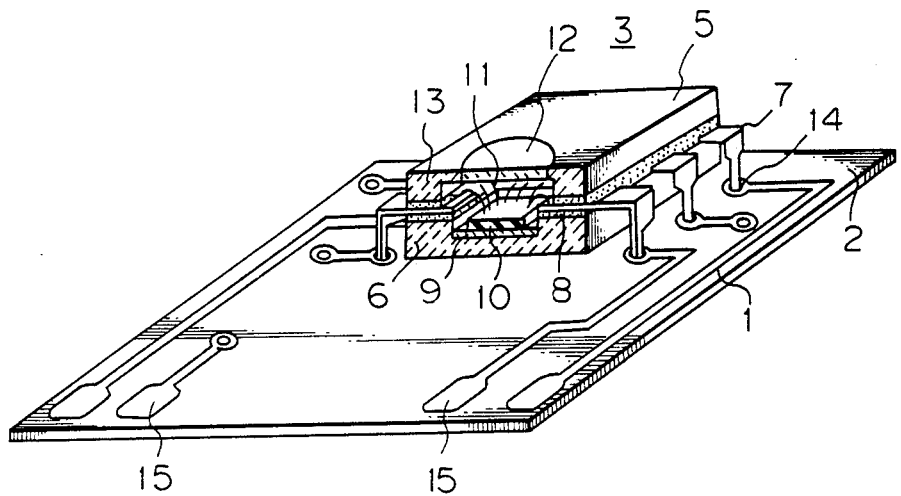
FIG. 1 is a perspective view, partly in cross section, of a conventional construction composed of a printed-circuit board on which an EPROM device is mounted.
Figure 2:
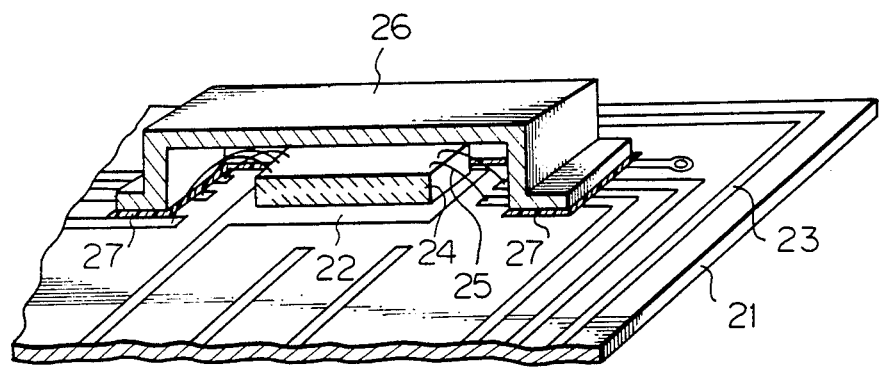
FIG. 2 is perspective view, partly in cross section, of a construction according to the present invention, which is composed of a printed-circuit board on which an EPROM device is mounted.

In FIG. 2, there are printed on the primary surface of an insulating baseboard 21 a semiconductor IC chip support region 22 made of electrically conductive material such as copper, and an electrically conductive circuit pattern 23 of the same material as that of the support region 22. The circuit pattern 23 terminates in a contact region (not shown) disposed near an end of the insulating baseboard 21 for contact with a female connector. The insulating baseboard 21 is preferably made of a glass epoxy resin material resistant to heat up to a temperature of about 200° C.

An EPROM IC chip 24 is fixed to the surface of the IC chip support region 22 by an electrically conductive adhesive, preferable silver paste. The silver paste will be hardened by being heated at 150° C. for about an hour.

Pad electrodes of the IC chip 24 and the printed circuit pattern 23 are mutually bonded by gold wires each having a diameter ranging from 30, to 35 μm, for example.

A hollow cap 26 made of a material capable of transmitting ultraviolet radiation therethrough is bonded by a synthetic resin material 27 so as to cover completely the EPROM chip 24 and thin metal wires 25. The material capable of transmitting ultraviolet radiation therethrough may comprise ultraviolet (UV) glass, quartz, or alumina. The material may also be a synthetic resin material such for example as TX-1160 (commercial name, manufactured by Toray Industries, Inc.). The bonding synthetic resin material may be an epoxy resin adhesive NOP-01 (commercial name, manufactured by Kyoto Ceramics Co., Ltd.). This adhesive will be hardened by being heated at 150° C. for about an hour.

In the embodiment of the present invention, the IC chip 24, for example, a 16K-bit EPROM, has a size of $5 \times 5$ mm$^2$, and can be fully accommodated in the hollow cap 26 which has dimensions of $10 \times 13 \times 1.9$ mm$^3$. The EPROM IC chip 24 is completely protected by the hollow cap 26 against external stresses, the entry of moisture, and impurities.

Information stored in the EPROM IC chip 24 can easily be erased by exposing the surface of the EPROM IC chip 24 to ultraviolet radiation having a wavelength of 253.7 nm, for example, through the cap 26 for about 5 minutes.

With the foregoing construction in which the EPROM IC is mounted, the EPROM IC can be mounted on a chip-on-board basis, thus eliminating the step of mounting the EPROM IC chip on a dual-in-line IC package and the step of mounting and soldering the IC package on the printed-circuit board. Therefore, a large reduction in the mounting cost can be achieved.

A 24-pin dual-in-line ceramic package takes up a volume of $14 \times 33 \times 4.5$ (W$\times$L$\times$H) mm$^3$. The cap of the present invention has dimensions of $10 \times 13 \times 1.9$ mm$^3$, and takes up a volume which is less than $\frac{1}{8}$ of that of the above ceramic package and has a thickness which is less than $\frac{1}{2}$ of that of the ceramic package. Therefore, the printed-circuit construction is smaller in size and lower in profile.

Where a ceramic package containing a number of EPROM IC chips is mounted on a printed-circuit board, the weight is increased and hence the overall construction is incovenient to handle. The mounting construction according to the present invention, however, has a weight which is reduced to about 1/20 of that of the conventional construction.

The EPROM IC mounting construction of the present invention is especially suitable for use on home-use digital devices including external memories.

Although a certain preferred embodiment has been shown and described, it should be understood that many changes and modifications may be made therein without departing from the scope of the appended claims.

What is claimed is:

1. A printed-circuit construction comprising:
   (a) an insulating glass epoxy resin baseboard having heat-resistant characteristics and having on a primary surface thereof a conductive chip support region and a plurality of conductive wiring patterns;
   (b) an EPROM IC chip having a plurality of pad electrodes on the surface thereof and fixed on said chip support region of said insulating baseboard with an electrically conductive adhesive;
   (c) a plurality of thin metal wires each which connects each pad electrode of said EPROM IC chip with each of said electrically conductive wiring patterns; and
   (d) a hollow cap made of a material capable of transmitting ultraviolet rays therethrough and fixed on said primary surface of said insulating baseboard with a synthetic resin adhesive so as to cover said EPROM IC chip and said thin metal wires.

2. A construction according to claim 1, wherein said cap is made of a material selected from the group consisting of ultraviolet transmitting glass, quartz and alumina.

3. A construction according to claim 1, wherein said cap is made of a synthetic resin material.

* * * * *